United States Patent
Su et al.

(10) Patent No.: US 7,228,479 B2
(45) Date of Patent: Jun. 5, 2007

(54) IEEE STD. 1149.4 COMPATIBLE ANALOG BIST METHODOLOGY

(75) Inventors: Chauchin Su, Taipei (TW);
Shyh-Horng Lin, Taipei (TW);
Laung-Terng (L.-T.) Wang, Sunnyvale, CA (US)

(73) Assignee: Syntest Technologies, Inc., Sunnyvale, CA (US)

( * ) Notice: Subject to any disclaimer, the term of this patent is extended or adjusted under 35 U.S.C. 154(b) by 0 days.

(21) Appl. No.: 11/211,092

(22) Filed: Aug. 25, 2005

(65) Prior Publication Data

US 2006/0059395 A1 Mar. 16, 2006

Related U.S. Application Data

(60) Provisional application No. 60/606,106, filed on Sep. 1, 2004.

(51) Int. Cl.
*G01R 31/28* (2006.01)
(52) U.S. Cl. .................................................. 714/740
(58) Field of Classification Search ............... 714/724, 714/726, 729, 740
See application file for complete search history.

(56) References Cited

U.S. PATENT DOCUMENTS 6,492,798 B2 * 12/2002 Sunter ..................... 324/76.15
7,032,151 B2 * 4/2006 Halder et al. ............... 714/740
7,102,555 B2 * 9/2006 Collins et al. .............. 341/120
2002/0099990 A1 * 7/2002 Sunter ....................... 714/727

OTHER PUBLICATIONS

IEEE Standard for a Mixed Signal Test Bus, IEEE Std. 1149.4, IEEE, 1999.
C. Su and Y.T. Chen, "Intrinsic Response Extraction for the Analog Test Bus Parasitic Effect Removal," *IEEE Trans. on Computer-Aided Design*, vol. 19, No. 4, pp. 437-445, Apr. 2000.
S. Sunter, K. Filliter, W. Joe, and P. McHugh, "A General Purpose 1149.4 IC with HF Analog Test Capabilities," *Prof. Int'l Test Conf.*, pp. 38-45, 2001.
G.O.G. Acevedo and J. Ramirez-Angulo, "Built-in Self-Test Scheme for On-chip diagnosis, Compliant with the IEEE 1149.4 Mixed Signal Test Bus Standard," *Proc. IEEE Int'l Symp. on Circuits and Systems*, pp. 26-29, 2002.
C. Su, C.-H. Wang; W.-J. Wang; and I.S. Tseng, "1149.4 Based On-Line Quiescent State Monitoring Technique," *Proc. IEEE VLSI Test Symp.*, pp. 197-202, 2003.

* cited by examiner

*Primary Examiner*—Cynthia Britt
(74) *Attorney, Agent, or Firm*—Jim Zegeer

(57) ABSTRACT

An analog built-in self-test (BIST) methodology based on the IEEE 1149.4 mixed signal test bus standard. The on-chip generated triangular stimuli are transmitted to the analog circuit under test (CUT) through the analog test buses, and their test responses are quantized by the dual comparators. The quantized results are then fed into a pair of counters to record the sampled counts for comparison in the decision circuit. A pass/fail indication is then generated in the decision circuit to indicate success or failure of the CUT after the BIST operation is complete.

14 Claims, 5 Drawing Sheets

$$\begin{cases} P_{L1} = 0.5 - \dfrac{V_X - V_{R-}}{2V_A} \\ P_{L2} = \dfrac{V_{R+} - V_{R-}}{2V_A} \\ P_{L3} = 0.5 - \dfrac{V_{R+} - V_X}{2V_A} \end{cases}$$

$$\begin{cases} P_{L1} = 0.5 - \dfrac{V_X - V_{R-}}{2V_A} \\ P_{L2} = 0.5 + \dfrac{V_X - V_{R-}}{2V_A} \\ P_{L3} = 0. \end{cases}$$

$$\begin{cases} P_{L1} = 0 \\ P_{L2} = 0.5 + \dfrac{V_{R+} - V_X}{2V_A} \\ P_{L3} = 0.5 - \dfrac{V_{R+} - V_X}{2V_A} \end{cases}$$

FIG. 4

IEEE STD. 1149.4 COMPATIBLE ANALOG BIST METHODOLOGY

RELATED APPLICATION DATA

This application claims the benefit of U.S. Provisional Application No. 60/606,106 filed Sep. 1, 2004.

FIELD OF THE INVENTION

The present invention relates to a test methodology, and more particularly, relates to IEEE Std. 1149.4 compatible analog built-in self-test (BIST) methodology.

BACKGROUND OF THE INVENTION

The IEEE 1149.4 mixed signal test bus standard [Reference 1], approved by the IEEE in 1999, mainly focuses on analog interconnect testing at board level. It experiences difficulties in providing high-frequency functional testing due to its insufficient bandwidth caused by the parasitic effects of the long multi-drop analog bus [Reference 2] as shown in FIG. 1. Nevertheless, it provides a common platform for further development.

IEEE Std. 1149.4 relies on two analog buses, AB1/AT1 and AB2/AT2, to transfer test stimuli and responses. The most significant side effect for using multi-drop buses is the limited bandwidth. Sunter et al. [Reference 3] improves the frequency response by redesigning analog boundary module (ABM) and test bus interface circuit (TBIC). With which, the signal frequency can be as high as 10 MHz. Su et al. [Reference 2] takes a digital signal processing (DSP) approach to eliminate the parasitic effects via the de-convolution. Acevedo et al. [Reference 4] proposed a VDDQ built-in self-test (BIST) architecture to compare the quiescent voltage of the circuit nodes with a pre-stored voltage to determine the pass/fail of the circuit. Su et al. [Reference 5] uses the dual comparators in TBIC to quantize the quiescent voltage and statistical method to obtain the DC offset voltage. Su et al. and Sunter et al. [References 2,3] focus on frequency response improvement, and Acevedo et al. and Su et al. [References 4,5] work on the quiescent voltage measurement. None of them can handle the dynamic test issue in BIST.

SUMMARY OF THE INVENTION

The objective of the invention is to create a dynamic analog built-in self-test (BIST) methodology to test an analog circuit under test (CUT).

Another objective of the invention is to create a dynamic analog BIST architecture to test the CUT.

Another objective of the invention is to detect AC amplitude ($V_A$) and DC offset ($V_X$) by means of a pair of counters.

In accordance with the present invention, an IEEE Std. 1149.4 compatible analog BIST methodology for testing the CUT comprises the steps of:
 (a) applying a test waveform to said analog circuit under test (CUT) through a first bus and forming a response waveform;
 (b) comparing said response waveform received from said CUT in dual comparators via a second bus and forming compared results;
 (c) feeding said compared results to a pair of counters each for counting a number of times whenever said comparator output connected to said counter is at a selected state; and
 (d) determining the pass/fail of said CUT in a decision circuit after a predetermined number of clocks according to the counts recorded in said counters.

In accordance with one aspect of the present invention, the methodology can test across chip boundary.

In accordance with one aspect of the present invention, the methodology can test analog modules on another chip.

In accordance with one aspect of the present invention, the methodology uses dual comparators to compare the responses of triangular stimulus with two reference voltages to obtain the AC amplitude and DC offset of said response waveform.

In accordance with one aspect of the present invention, the selected state is "1".

According to the present invention, an IEEE Std. 1149.4 based BIST architecture or apparatus for testing the CUT comprises:
 (a) a wave generator for generating and applying a test waveform to said CUT through a first bus and forming a response waveform;
 (b) dual comparators for receiving said response waveform from said CUT via a second bus and forming compared results;
 (c) a pair of counters for receiving said compared results and counting a number of times whenever said comparator output connected to said counter is at a selected state; and
 (d) a decision circuit for determining the pass/fail of said CUT after a predetermined number of clocks according to the counts recorded in said counters.

In accordance with one aspect of the present invention, the architecture can test across chip boundary.

In accordance with one aspect of the present invention, the architecture can test analog modules on another chip.

In accordance with one aspect of the present invention, the architecture uses dual comparators to compare the responses of triangular stimuli with two reference voltages to obtain the AC amplitude and DC offset of said response waveform.

In accordance with one aspect of the present invention, the selected state is "1".

THE BRIEF DESCRIPTION OF DRAWINGS

The above and other objects, advantages and features of the invention will become more apparent when considered with the following specification and accompanying drawings wherein:

FIG. 4 shows three different relationships between triangular waveforms and reference voltages, in accordance with the present invention.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
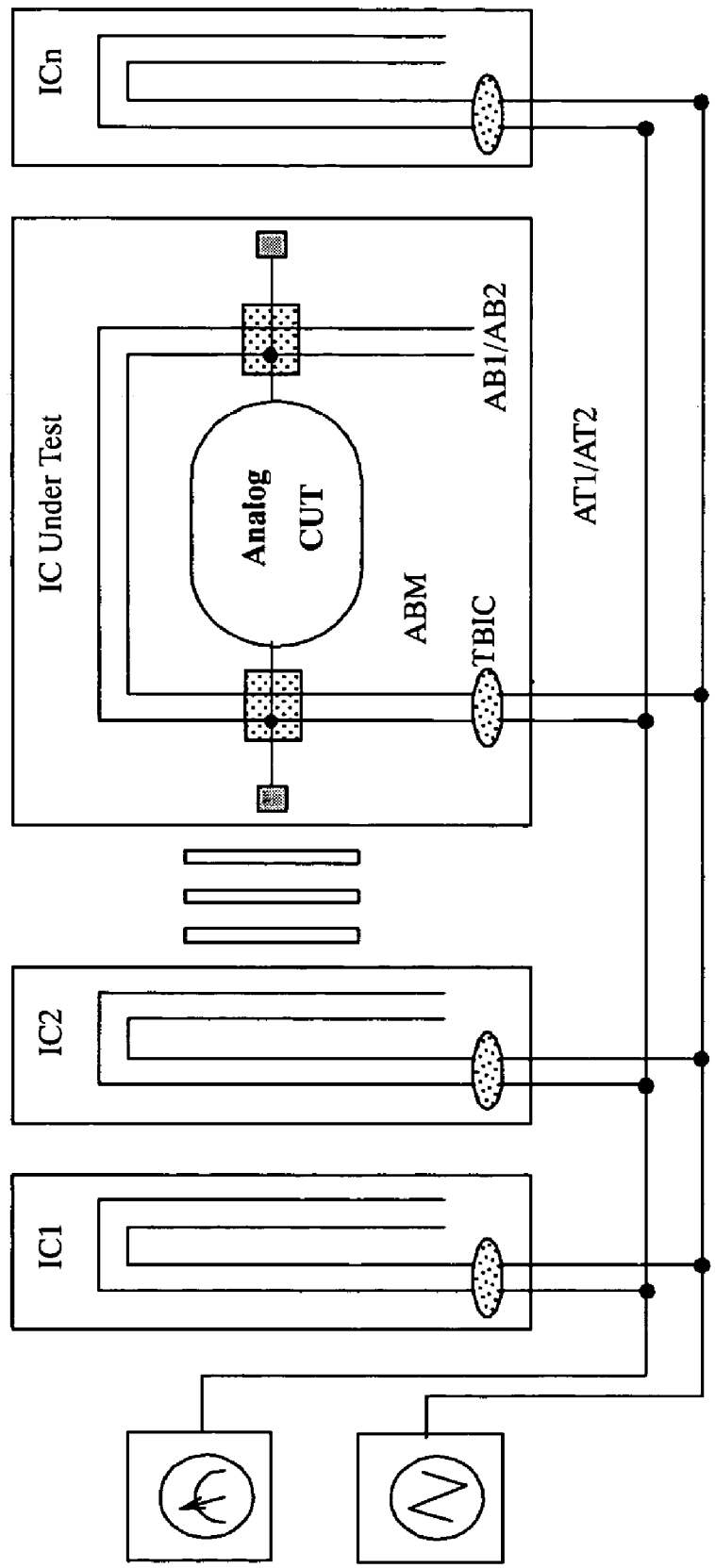
FIG. 1 shows a prior art IEEE Std. 1149.4 DFT architecture.
Figure 2:
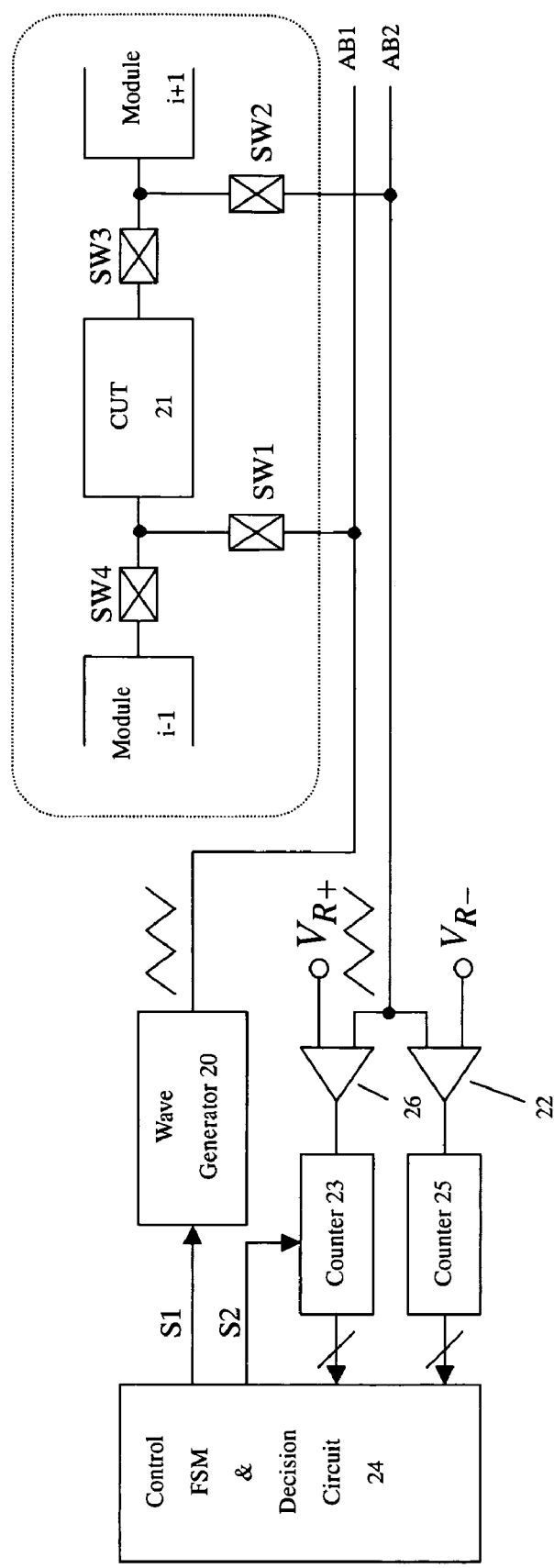
FIG. 2 shows an analog BIST architecture, in accordance with the present invention.

FIG. 2 shows the proposed 1149.4 based BIST architecture. Upon receiving the control signal S1 from the control FSM & decision circuit 24, the wave generator 20 generates a test waveform on-chip and applies it to the CUT 21 through the bus AB1 and switch SW1. Switch SW4 is turned off. The response waveform of the CUT 21 is transferred back to the dual comparators 22 and 26 for forming compared results, through switches SW2, SW3, and another bus AB2. The compared results are fed to a pair of counters 23 and 25. Through the control signal S2, both counters 23 and 25 count the number of times whenever their respective comparator output is at a selected state "1". After a predetermined number of clocks, the pass/fail of the circuit can then be determined by the decision circuit 24 according to the counts recorded in the counters 23 and 25.

Figure 3:
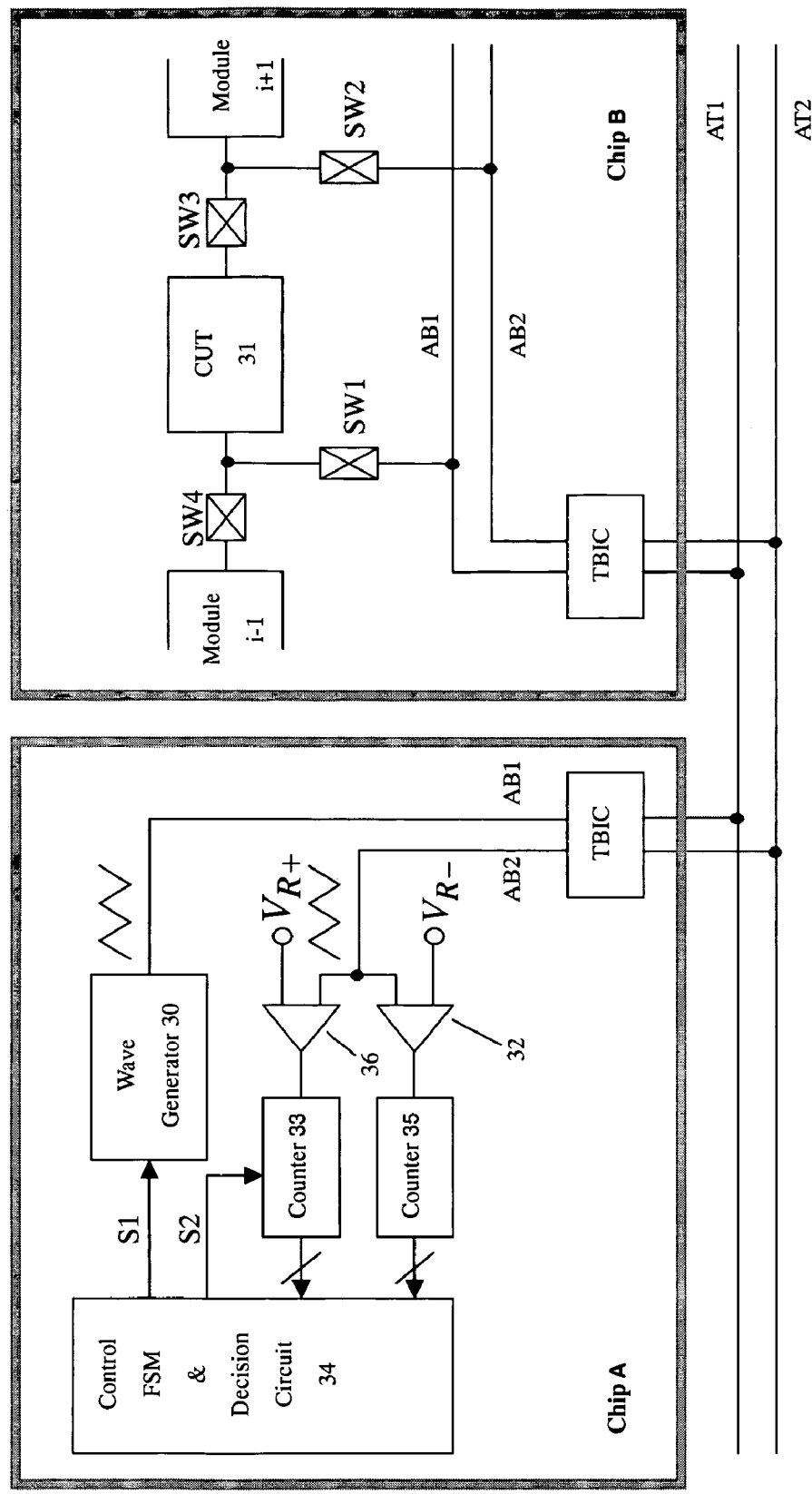
FIG. 3 shows a board-level analog BIST architecture, in accordance with the present invention.
Figure 5:
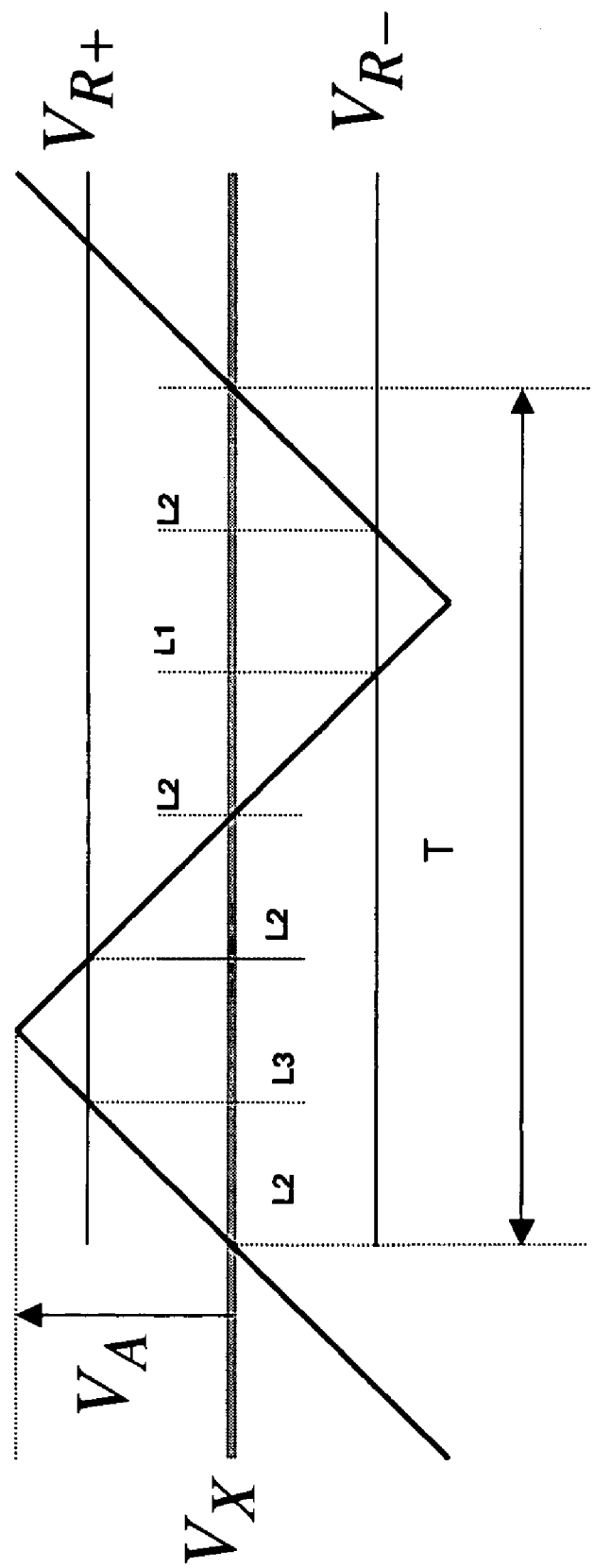
FIG. 5 shows a triangular waveform for comparison with $V_{R+}$ and $V_{R-}$, in accordance with the present invention.

The proposed BIST architecture can also test across chip boundary. In other words, the BIST circuitry on one chip can test analog modules on another chip. An example board-level block diagram is shown in FIG. 3. The elements include a wave generator 30, two comparators 32 and 36, two counters 33 and 35, and a control FSM & decision circuit 34 on Chip A, and a CUT 31 on Chip B. Upon receiving the control signal S1 from the control FSM & decision circuit 34, the wave generator 30 on Chip A generates a test waveform and applies it through buses AB1 and AT1, and switches SW1 to the CUT 31 on Chip B. Switch SW4 is turned off. Similarly, the response waveform of the CUT 31 on Chip B is transferred back through switch SW2, SW3 and busses AB2 and AT2 to the dual comparators 32 and 36 resided on Chip A for forming compared results. The compared results are fed to a pair of counters 33 and 35. Through the control signal S2, both counters 33 and 35 count the number of times whenever their respective comparator output is at a selected state "1".

Under such a configuration, only one chip on a board is required to have the BIST hardware built-in. The rest would only need the standard 1149.4 function. This is a significant advantage to have an 1149.4 compatible BIST methodology. Similarly, it can also conduct external test.

The proposed BIST methodology uses dual comparators 32 and 36 to compare the responses of triangular stimuli with two reference voltages ($V_{R+}$ and $V_{R-}$) to obtain the AC amplitude and DC offset of the response waveform. From the gain and DC offset, we are able to determine the gain and DC offset of the CUT 31. FIG. 4 shows the response waveform and the reference voltages. The triangular response has DC offset of $V_X$ and AC amplitude of $V_A$.

When a triangular waveform is compared to two reference voltages, the waveform can be divided into three regions.

$$\begin{cases} L1: v \leq V_{R-} \\ L2: V_{R-} \leq v \leq V_{R+} \\ L3: v \geq V_{R+}. \end{cases} \quad (1)$$

The corresponding time intervals for these regions are $$\begin{cases} T1 = \left(0.5 - \frac{V_X - V_{R-}}{2V_A}\right)T \\ T2 = \frac{V_{R+} - V_{R-}}{2V_A}T \\ T3 = \left(0.5 - \frac{V_{R+} - V_X}{2V_A}\right)T. \end{cases} \quad (2)$$

When the output of the dual comparators are randomly sampled by an asynchronous clock, as shown in FIG. 2, the probability being in region L1, L2, and L3 are, the ratio of (2) to T.

$$\begin{cases} P_{L1} = 0.5 - \frac{V_X - V_{R-}}{2V_A} \\ P_{L2} = \frac{V_{R+} - V_{R-}}{2V_A} \\ P_{L3} = 0.5 - \frac{V_{R+} - V_X}{2V_A}. \end{cases} \quad (3)$$

FIG. 4 shows the cases of three different relationships of the waveforms to the reference voltages. Here, we exclude the cases there is no intersection between the reference voltages and the waveform.

The above derivation is from the case when $V_X$ and $V_A$ are known. For a waveform under measurement, $V_X$ and $V_A$ are to be determined. Hence the measurement procedure is rather simply. After certain number of samples, we can obtain $P_{L1}$, $P_{L2}$, and $P_{L3}$ from the counts on the counters. Suppose that a total of N samples are taken. There are N1 samples greater than $V_{R+}$ and N2 samples smaller than $V_{R-}$. The probabilities can be obtained from $$P_{L1} = \frac{N2}{N} \quad P_{L2} = \frac{N - N1 - N2}{N} \quad P_{L3} = \frac{N1}{N}. \quad (4)$$

For a typical case, the first case in FIG. 4, we can solve the linear equations in (3) to obtain $$V_A = \frac{V_{R+} - V_{R-}}{2P_{L2}}. \quad (5)$$

$$V_X = V_{R-} \frac{0.5 - P_{L1}}{P_{L2}}(V_{R+} - V_{R-}). \quad (6)$$

In other words, after we obtain $P_{L1}$, $P_{L2}$, and $P_{L3}$ from the counters using (4), we are able to calculate $V_X$ and $V_A$ by (5) and (6). As a result, we can use the digital approach to measure the AC amplitude and DC offset of an analog waveform. Note that, although there are three equations in (3), one of them is redundant because of $P_{L1}+P_{L2}+P_{L3}=1$. A question is raised, how many samples to take in order to have certain accuracy. Note that, Case 2 and 3 in FIG. 4 are invalid because there is no solution for $V_X$ and $V_A$ if both of them are unknown.

In this invention, we have proposed an analog BIST methodology based on the infrastructure of the IEEE Std. 1149.4. A triangular waveform is generated on-chip as test stimuli. It is applied to the CUT through the AB1 bus. The response waveform, also triangular, is transferred back to the dual comparators via the AB2 bus. After the binary quantization is done by the dual comparators, it is recorded by a pair of counters, where the DC offset and AC amplitude of the response waveform is calculated by a first-order linear equation.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

REFERENCES CITED [REFERENCED BY]

[1] IEEE Standard for a Mixed Signal Test Bus, IEEE Std. 1149.4, IEEE, 1999.
[2] C. Su and Y. T. Chen, "Intrinsic Response Extraction for the Analog Test Bus Parasitic Effect Removal," *IEEE Trans. on Computer-Aided Design*, Vol. 19, No. 4, pp. 437–445, April 2000.
[3] S. Sunter, K. Filliter, W. Joe, and P. McHugh, "A General Purpose 1149.4 IC with HF Analog Test Capabilities," *Prof. Int'l Test Conf.*, pp. 38–45, 2001.
[4] G. O. G. Acevedo and J. Ramirez-Angulo, "Built-in Self-Test Scheme for On-chip diagnosis, Compliant with the IEEE 1149.4 Mixed Signal Test Bus Standard," *Proc. IEEE Int'l Symp. on Circuits and Systems*, pp. 26–29, 2002.
[5] C. Su, C.-H. Wang; W.-J. Wang; and I. S. Tseng, "1149.4 Based On-Line Quiescent State Monitoring Technique," *Proc. IEEE VLSI Test Symp.*, pp. 197–202, 2003.

What is claimed is:

1. A method for testing an analog circuit under test (CUT) using an IEEE Std. 1149.4 compatible analog built-in self-test (BIST) methodology, said method comprising the steps of:
    (a) applying a triangular test waveform stimuli to said analog CUT through a first bus and forming a response triangular waveform;
    (b) comparing said response waveform received from said CUT in dual comparators via a second bus and forming compared results;
    (c) feeding said compared results to a pair of counters each for counting a number of times whenever said comparator output connected to said counter is at a selected state; and
    (d) determining the pass/fail of said analog CUT in a decision circuit after a predetermined number of clocks according to the counts recorded in said counters.

2. The method of claim 1, wherein said method can test across chip boundary.

3. The method of claim 2, wherein said method can test analog modules on another chip.

4. The method of claim 1, wherein said method uses said dual comparators to compare the responses of triangular waveform with two reference voltages to obtain the AC amplitude and DC offset of said response waveform.

5. The method of claim 1, wherein said selected state is "1".

6. An apparatus for testing an analog circuit under test (CUT) using an IEEE Std. 1149.4 compatible analog built-in self-test (BIST) methodology, said apparatus comprising:
    (a) a wave generator for generating and applying a triangular test waveform to said CUT through a first bus and forming a triangular response waveform;
    (b) dual comparators for receiving said triangular response waveform from said CUT via a second bus and forming compared results;
    (c) a pair of counters for receiving said compared results, respectively, and counting a number of times whenever said comparator output connected to said counter is at a selected state; and
    (d) a decision circuit for determining the pass/fail of said CUT after a predetermined number of clocks according to the counts recorded in said counters.

7. The apparatus of claim 6, wherein said apparatus can test across chip boundary.

8. The apparatus of claim 7, wherein said apparatus can test analog modules on another chip.

9. The apparatus of claim 6, wherein said apparatus uses said dual comparators to compare the responses of said triangular waveform stimuli with two reference voltages to obtain the AC amplitude and DC offset of said response waveform.

10. The apparatus of claim 6, wherein said selected state is "1".

11. A method for testing an integrated circuit chip containing an analog circuit under test comprising the steps of providing on said chip an on-chip generated triangular stimuli and transmitting said on-chip generated triangular stimuli to the analog circuit under test through a pair of analog test buses, quantizing the test responses in dual comparators and feeding the quantized results to a pair of counters to record the sample counts for comparison in a decision circuit.

12. The invention defined in claim 11 including providing a pass/fail indication generated when the decision circuit indicates success or failure of an analog circuit under test after the test operation is complete.

13. A method for testing an integrated circuit chip containing an analog circuit under test comprising the steps of providing on said chip a triangular waveform stimuli and transmitting said a triangular waveform stimuli to the analog circuit under test through a pair of analog test buses, quantizing the test responses in dual comparators and feeding the quantized results to a pair of counters to record the sample counts for comparison in a decision circuit.

14. The invention defined in claim 13 including providing a pass/fail indication generated when the decision circuit indicates success or failure of an analog circuit under test after the test operation is complete.

* * * * *